US011040989B2

(12) United States Patent
Rekken et al.

(10) Patent No.: US 11,040,989 B2
(45) Date of Patent: Jun. 22, 2021

(54) TRIS(DISILANYL)AMINE

(71) Applicant: Jiangsu Nata Opto-Electronic Materials Co. Ltd., Jiangsu (CN)

(72) Inventors: Brian D. Rekken, Midland, MI (US); Xiaobing Zhou, Midland, MI (US); Byung K. Hwang, Midland, MI (US); Barry Ketola, Freeland, MI (US)

(73) Assignee: Jiangsu Nata Opto-Electronic Materials Co., Ltd., Jiangsu (CN)

( * ) Notice: Subject to any disclaimer, the term of this patent is extended or adjusted under 35 U.S.C. 154(b) by 244 days.

(21) Appl. No.: 15/776,851

(22) PCT Filed: Dec. 16, 2016

(86) PCT No.: PCT/US2016/067075
§ 371 (c)(1),
(2) Date: May 17, 2018

(87) PCT Pub. No.: WO2017/106587
PCT Pub. Date: Jun. 22, 2017

(65) Prior Publication Data
US 2018/0334469 A1 Nov. 22, 2018

Related U.S. Application Data

(60) Provisional application No. 62/269,286, filed on Dec. 18, 2015.

(51) Int. Cl.
| C07F 7/10 | (2006.01) |
| C07F 7/20 | (2006.01) |
| C07F 7/02 | (2006.01) |
| B01J 31/14 | (2006.01) |
| C01B 21/087 | (2006.01) |
| C01B 33/027 | (2006.01) |
| C08G 77/62 | (2006.01) |
| C23C 16/455 | (2006.01) |
| H01L 21/02 | (2006.01) |
| C07F 7/08 | (2006.01) |
| C23C 16/34 | (2006.01) |

(52) U.S. Cl.
CPC ............... C07F 7/10 (2013.01); B01J 31/146 (2013.01); C01B 21/087 (2013.01); C01B 33/027 (2013.01); C07F 7/025 (2013.01); C07F 7/0803 (2013.01); C07F 7/20 (2013.01); C08G 77/62 (2013.01); C23C 16/345 (2013.01); C23C 16/45553 (2013.01); H01L 21/02208 (2013.01); B01J 2231/005 (2013.01); B01J 2531/002 (2013.01)

(58) Field of Classification Search
None
See application file for complete search history.

(56) References Cited

U.S. PATENT DOCUMENTS

| 8,871,656 B2 | 10/2014 | Mallick et al. |
| 2014/0051264 A1 | 2/2014 | Mallick et al. |
| 2014/0127188 A1 | 5/2014 | Cernok et al. |
| 2015/0094470 A1 | 4/2015 | Sanchez et al. |

OTHER PUBLICATIONS

Ward, et al., "The preparation and properties of bis-disilanyl sulphide and tris-disilanylamine", J. Inorg. Nucl. Chem., vol. 21, No. 3-4, pp. 287-293 (1961).
Search report corresponding to China Application No. 201680070868.6 dated Apr. 9, 2020.
Ward, et al, "The preparation and properties of a bis-disilanyl sulphide and tris-disilanylamine", Journal of Inorganic and Nuclear Chemistry, Dec. 1, 1961, pp. 287-293, vol. 21, No. 3-4.
International search report for corresponding International Application No. PCT/US2016/067075 dated Feb. 20, 2017.

Primary Examiner — Joseph R Kosack
(74) Attorney, Agent, or Firm — Morgan, Lewis & Bockius LLP

(57) ABSTRACT

A method for making tris(disilanyl)amine. The method comprises steps of: (a) contacting a disilanyl(alkyl)amine with ammonia to make bis(disilanyl)amine; and (b) allowing bis(disilanyl)amine to produce tris(disilanyl)amine and ammonia.

6 Claims, No Drawings

TRIS(DISILANYL)AMINE

This invention relates to a method for making tris(disilanyl)amine

Tris(disilanyl)amine is a known compound, first reported in L. G. L. Ward & A. G. MacDiarmid, *J. Inorg. Nucl. Chem.*, 1961 (21) 287-293. However, examination of the elemental analysis of the product obtained in this reference reveals that the maximum possible purity obtained was 97.32%.

The problem solved by this invention is the need for additional methods to produce tris(disilanyl)amine.

STATEMENT OF THE INVENTION

The present invention provides a method for making tris(disilanyl)amine. The method comprises steps of: (a) contacting a disilanyl(alkyl)amine with ammonia to make bis(disilanyl)amine; and (b) allowing bis(disilanyl)amine to produce tris(disilanyl)amine and ammonia.

DETAILED DESCRIPTION

Percentages are weight percentages (wt %) and temperatures are in ° C. unless specified otherwise. Operations were performed at room temperature (20-25° C.) unless specified otherwise. Alkyl groups are saturated $C_1$-$C_{20}$ hydrocarbyl groups that may be straight or branched.

A disilanyl(alkyl)amine is any compound with the formula $(Si_2H_5)NR^1R^2$, wherein $R^1$ and $R^2$ independently are hydrogen or alkyl, provided that at least one of $R^1$ and $R^2$ is alkyl, preferably $C_1$-$C_8$ alkyl, preferably $C_2$-$C_6$ alkyl, preferably $C_2$-$C_4$ alkyl. Isopropyl is especially preferred. Preferably, both $R^1$ and $R^2$ are alkyl. Preferably, $R^1$ and $R^2$ are identical. Bis(disilanyl)amine has the formula $(Si_2H_5)_2NH$.

The present invention is further directed to a method for making tris(disilanyl)amine; said method comprising allowing bis(disilanyl)amine to produce tris(disilanyl)amine and ammonia.

The present invention is further directed to tris(disilanyl)amine having a purity of at least 97.5%, preferably at least 98%. Purity is determined by gas chromatography utilizing a TCD detector.

Preferably, bis(disilanyl)amine is heated at a temperature from 20 to 280° C.; preferably at least 40° C., preferably at least 70° C., preferably at least 90° C.; preferably no greater than 200° C., preferably no greater than 170° C., preferably no greater than 150° C. Preferably, the heating time is from 8 to 48 hours, preferably 12 to 36 hours. The proper heating time may easily be determined based on apparatus, other parameters, etc. Preferably, tris(disilanyl)amine is purified by distillation.

Preferably, a disilanyl(alkyl)amine and ammonia are contacted at a pressure greater than atmospheric pressure, preferably as least 1.5 atm (152 kPa), preferably at least 2 atm (202 kPa); preferably no greater than 10 atm (1,010 kPa), preferably no greater than 6 atm (606 kPa). Preferably, ammonia is added to the disilanyl(alkyl)amine Preferably, the mole ratio of disilanyl(alkyl)amine:ammonia is from 100:1 to 1:1000, preferably from 3:1 to 1:3, preferably from 2:1 to 1:1. Preferably, at least a portion of diisopropylamine is removed by distillation.

The present invention is further directed to a composition for film forming, the composition comprising tris(disilanyl)amine and at least one of an inert gas, molecular hydrogen, a carbon precursor, nitrogen precursor, and oxygen precursor.

The present invention is further directed to a method of forming a silicon-containing film on a substrate, the method comprising subjecting a vapor of a silicon precursor comprising tris(disilanyl)amine to deposition conditions in the presence of the substrate so as to form a silicon-containing film on the substrate. The present invention is further directed to a film formed in accordance with the method.

A vaporous or gaseous state of the molecular hydrogen, carbon precursor, nitrogen precursor or oxygen precursor may be generally referred to herein as an additional reactant gas.

The carbon precursor may be used with tris(disilanyl)amine for forming a silicon carbon film, which contains Si and C atoms and may comprise silicon carbide. A carbon precursor that comprises C, H, and optionally Si atoms may further comprise N or O atoms when the carbon precursor is used in the method for forming a silicon carbonitride film or silicon oxycarbide film, respectively, or may further comprise N and O atoms when the carbon precursor is used in the method for forming a silicon oxycarbonitride film. A carbon precursor that consists essentially of C, H, and optionally Si atoms lacks N and O atoms, but may optionally have one or more halogen atoms (e.g., Cl). Examples of the carbon precursor consisting of C and H atoms are hydrocarbons such as alkanes. Examples of the carbon precursor consisting of C, H and Si atoms are hydrocarbylsilanes such as butyldisilane or tetramethylsilane.

The nitrogen precursor may be used with tris(disilanyl)amine in the composition for forming a silicon nitrogen film according to an embodiment of the method. The nitrogen precursor is different than tris(disilanyl)amine The silicon nitrogen film contains Si and N atoms and optionally C and/or O atoms and may comprise silicon nitride, silicon oxynitride, or silicon oxycarbonitride. The silicon nitride may be $Si_xN_y$, wherein x is 1, 2 or 3 and y is an integer from 1 to 5. A nitrogen precursor that comprises N and optionally H atoms may further comprise C or O atoms when the nitrogen precursor is used in the method for forming a silicon carbonitride film or silicon oxynitride film, respectively, or for may further comprise C and O atoms when the nitrogen precursor is used in the method for forming a silicon oxycarbonitride film. A nitrogen precursor that consists essentially of N atoms and optionally H atoms lacks C and O atoms, but optionally may have one or more halogen atoms (e.g., Cl); an example is molecular nitrogen. Examples of a nitrogen precursor consisting of N and H atoms are ammonia and hydrazine. An example of a nitrogen precursor consisting of O and N atoms is nitric oxide and nitrogen dioxide.

The oxygen precursor may be used with tris(disilanyl)amine in the composition for forming a silicon oxygen film according to an embodiment of the method. The silicon oxygen film contains Si and O atoms and optionally C and/or N atoms and may comprise silicon oxide, silicon oxycarbide, silicon oxynitride, or silicon oxycarbonitride. The silicon oxide may be SiO or $SiO_2$. An oxygen precursor that comprises O atoms and optionally H atoms may further comprise C or N atoms when the oxygen precursor is used in the method for forming a silicon oxycarbide or silicon oxynitride film, respectively, or may further comprise C and N atoms when the oxygen precursor is used in the method for forming a silicon oxycarbonitride film. Examples of an oxygen precursor consisting of O atoms are molecular oxygen and ozone. Examples of an oxygen precursor consisting of O and H atoms are water and hydrogen peroxide. An example of an oxygen precursor consisting of O and N atoms is nitric oxide and nitrogen dioxide.

The inert gas may be used in combination with any one of the foregoing precursors. Examples of the inert gas are helium, argon, and a mixture thereof. For example, helium may be used in combination with tris(disilanyl)amine and molecular hydrogen in an embodiment of the method wherein the silicon containing film that is formed is an elemental silicon film. Alternatively, helium may be used with the Silicon Precursor Compound and any one of the carbon precursor, nitrogen precursor and oxygen precursor in an embodiment of the method wherein the silicon containing film that is formed is a silicon carbon film, silicon nitrogen film, or silicon oxygen film respectively.

The method of forming a film uses a deposition apparatus. The deposition apparatus utilized in the method is generally selected based upon the desired method of forming the film and may be any deposition apparatus known by those of skill in the art.

In a preferred embodiment, the deposition apparatus comprises a physical vapor deposition apparatus. The deposition apparatus is typically selected from a sputtering apparatus, an atomic layer deposition apparatus, and a direct current (DC) magnetron sputtering apparatus. The optimum operating parameters of each of these physical deposition vapor apparatuses are based upon the compound utilized in the method and the desired application in which the film formed via the deposition apparatus is utilized. In a preferred embodiment, the deposition apparatus comprises a sputtering apparatus, e.g., an ion-beam sputtering apparatus, a reactive sputtering apparatus, or an ion-assisted sputtering apparatus.

Preferably, the deposition apparatus comprises an atomic layer deposition apparatus or a chemical vapor deposition apparatus. These methods of forming the film may be referred to as atomic layer deposition methods or chemical vapor deposition methods, respectively. The apparatus and methods are generally well known in the art. A chemical vapor deposition apparatus may be, for example, a flowable chemical vapor apparatus, a thermal chemical vapor deposition apparatus, a plasma enhanced chemical vapor deposition apparatus, a photochemical vapor deposition apparatus, an electron cyclotron resonance apparatus, an inductively coupled plasma apparatus, a magnetically confined plasma apparatus, a low pressure chemical vapor deposition apparatus and a jet vapor deposition apparatus. The optimum operating parameters of each of these chemical deposition vapor apparatuses are based upon the compound utilized in the method and the desired application in which film formed via the deposition apparatus is utilized. Preferably, the deposition apparatus comprises a plasma enhanced chemical vapor deposition apparatus or a low pressure chemical vapor deposition apparatus.

In chemical vapor deposition, gases for forming the film are typically mixed and reacted in a deposition chamber. The reaction forms the proper film elements or molecules in a vapor state. The elements or molecules then deposit on a substrate (or wafer) and build up to form the film. Chemical vapor deposition generally requires the addition of energy to the system, such as heating of the deposition chamber and substrate.

Reaction of gaseous species is generally well known in the art and any conventional chemical vapor deposition (CVD) technique can be carried out via the present method. For example, methods such as simple thermal vapor deposition, plasma enhanced chemical vapor deposition (PECVD), electron cyclotron resonance (ECRCVD), atmospheric pressure chemical vapor deposition (APCVD), low pressure chemical vapor deposition (LPCVD), ultrahigh vacuum chemical vapor deposition (UHVCVD), aerosol-assisted chemical vapor deposition (AACVD), direct liquid injection chemical vapor deposition (DLICVD), microwave plasma-assisted chemical vapor deposition (MPCVD), remote plasma-enhanced chemical vapor deposition (RPECVD), atomic layer chemical vapor deposition (AL-CVD), hot wire chemical vapor deposition (HWCVD), hybrid physical-chemical vapor deposition (HPCVD), rapid thermal chemical vapor deposition (RTCVD), and vapor-phase epitaxy chemical vapor deposition (VPECVD), photo-assisted chemical vapor disposition (PACVD), flame assisted chemical vapor deposition (FACVD), or any similar technique may be used.

Chemical vapor deposition may be utilized to form films having a wide variety of thicknesses contingent on a desired end use of the film. For instance, the film may have a thickness of a few nanometers or a thickness of a few microns, or a greater or lesser thickness (or a thickness falling between these values). These films may optionally be covered by coatings, such as $SiO_2$ coatings, $SiO_2$/modifying ceramic oxide layers, silicon-containing coatings, silicon carbon-containing coatings, silicon carbide-containing coatings, silicon nitrogen-containing coatings, silicon nitride-containing coatings, silicon nitrogen carbon-containing coatings, silicon oxygen nitrogen containing coatings, and/or diamond like carbon coatings. Such coatings and their methods of deposition are generally known in the art.

The substrate utilized in the method is not limited. In certain embodiments, the substrate is limited only by the need for thermal and chemical stability at the temperature and in the environment of the deposition chamber. Thus, the substrate can be, for example, glass, metal, plastic, ceramic, silicon (e.g. monocrystalline silicon, polycrystalline silicon, amorphous silicon, etc).

Embodiments of the present method may include a reactive environment comprising nitrous oxide. Such reactive environments are generally known in the art. In these embodiments, the method generally involves decomposing the silicon compound in the presence of nitrous oxide. An example of such a method is described in. U.S. Pat. No. 5,310,583. Utilizing nitrous oxide may modify the composition of the resulting film formed in the chemical vapor deposition method.

The chemical vapor deposition apparatus and, thus, the chemical vapor deposition method utilized is generally selected by balancing a number of factors, including, but not limited to, tris(disilanyl)amine, desired purity of the film, geometric configuration of the substrate, and economic considerations. The main operating variables manipulated in chemical vapor deposition include, but are not limited to, temperature, substrate temperature, pressure, a concentration in the gas phase of tris(disilanyl)amine, any additional reactant gas concentration (e.g., concentration of gas of any carbon precursor, nitrogen precursor, and/or oxygen precursor), and total gas flow. Chemical vapor deposition is generated from chemical reactions which include, but are limited to, pyrolysis, oxidation, reduction, hydrolysis, and combinations thereof. Selecting the optimal temperature for chemical vapor deposition requires an understanding of both the kinetics and thermodynamics of the compound and the chosen chemical reaction.

Conventional chemical vapor deposition methods generally require significantly high temperatures, e.g. 600° to 1000° C. However, it is believed that tris(disilanyl)amine may be utilized in at much lower temperatures. For example, the method may be carried out at a temperature of from 100° to 700°; preferably at least 200°; preferably no more than 600°, preferably no more than 500°. The temperature at which the method is carried out may be isothermal or dynamic.

Chemical vapor deposition processes generally involve generating a precursor, transporting the precursor into a reaction chamber, and either absorption of precursors onto a heated substrate or chemical reaction of the precursor and subsequent absorption onto the substrate. The following sets forth a cursory survey of chemical vapor deposition methods to illustrate some of the vast options available.

In thermal CVD, the film is deposited by passing a stream of a vaporized form of tris(disilanyl)amine over a heated substrate. When the vaporized form of the compound contacts the heated substrate it generally reacts to form the film.

In PECVD, a vaporized form of tris(disilanyl)amine is reacted by passing it through a plasma field to form a reactive species. The reactive species is then focused and deposited on the substrate the form the film. The plasmas utilized in PECVD comprise energy derived from a variety of sources such as electric discharges, electromagnetic fields in the radio-frequency or microwave range, lasers or particle beams. Generally, PECVD utilizes radio frequency (10 kHz)-102 MHz) or microwave energy (0.1-10 GHz) at moderate power densities (0.1-5 (W/cm$^2$)), although any of these variables may be modified.

In AACVD, the compound is dissolved in a chemical medium to form a mixture which is packaged in a traditional aerosol. The aerosol atomizes and introduces the compound into a heated chamber where it undergoes a chemical reaction. One advantage of AACVD is the ability to form the film without necessitating a vacuum.

Environments which facilitate the desired deposition can also be used in the deposition chamber. For instance, reactive environments such as air, oxygen, oxygen plasma, ammonia, amines, hydrazine, etc. or inert environments may all be used herein.

Preferably, however, the deposition apparatus comprises an atomic layer deposition apparatus. In embodiments using the atomic layer deposition apparatus, the method of forming the film may be referred to as an atomic layer deposition method and includes plasma enhanced atomic layer deposition (PEALD), spatial atomic layer depositon (SALD) and thermal atomic layer deposition (TALD). Atomic layer deposition methods are generally well known in the art.

Because tris(disilanyl)amine contains at least one Si—N bond, it may be utilized to form silicon nitride films without use of a nitrogen precursor. One may be able to optimize the deposition conditions to control whether the present method forms an elemental Si film or a SiN film. If desired a nitrogen precursor may be used in the second vapor to enrich the nitrogen content of the film.

Alternatively, tris(disilanyl)amine may be utilized with other silicon-based precursor compounds traditionally utilized to form silicon films comprising crystalline silicon or silicon nitride. The films may be, for example, crystalline or epitaxial. Contingent on the presence of reactive environments during the method, the film may further comprise oxygen and/or carbon in addition to silicon and nitrogen.

Examples

Transamination of Diisopropyl(disilanyl)amine (DPDS) to Bis(disilanyl)amine (BDSA):
Loaded 375 g DPDS (99%) in 1.5 Liter high pressure (Parr) reactor.
While agitating DPDS at 470 rpm, vapor feed 28 g anhydrous NH$_3$ into the Parr reactor through the dip tube port over 60 minutes semi-continuously by pressuring up to ~40 psig and down to ~20 psig cycles.
The temperature ramped from 20° C. to 27° C. during the addition (cooling set at 20° C.)
Pressure started to rise after last NH$_3$ addition cycle. Cooling to 0° C. and N$_2$ Purge started
Continue cooling and purging for 1 hour.
Pressure rise stopped.
Transferred ~311 g material (~38% BDSA) to a stainless steel cylinder. Transferred cylinder to Low Oxygen and Moisture Glove Box.
Transferred material to 500 ml reactor in glove box.
Material sat at 0° C. overnight
Distilled crude over head after taking off a diisopropylamine (DIPA) forecut using a 5 stage column at ~150 mm Hg vacuum (20 kPa) and ~60° C.
Transamination of DPDS to BDSA:
Loaded 374 g DPDS (99%) in 1.5 Liter high pressure (Parr) reactor.
While agitating DPDS at 470 rpm, vapor feed 26.5 g NH$_3$ into the Parr reactor through the dip tube port over 60 minutes semi-continuously by pressuring up to ~40 psig and down to ~20 psig cycles.
The temperature ramped from 20° C. to 25° C. during the addition (cooling set at 20° C.)
Pressure started to rise after last NH$_3$ addition cycle. Cooling to 0° C. and N$_2$ Purge started
Continue cooling and purging for ~20 minutes.
Pressure rise stopped.
Transferred ~376 g material (~30% BDSA) to a cylinder. Transferred cylinder to Low Oxygen and Moisture Glove Box.
Transferred 376 g material to 500 ml jacketed reactor.
Material sat at 0° C. overnight.
Distilled crude over head after taking off a DIPA forecut using a 5 stage column at ~150 mm Hg vacuum (20 kPa and 60° C.
Thermal Degradation and Purification:
Combined two batches of purified BDSA described above.
Distilled out excess DIPA using a 10 stage column at 66° C. and 100 mmHg
Heat the BDSA in a flask at 100 to 110° C. for 27 hours to convert BDSA to tris(disilanyl)amine (TDSA).
Using a 10 stage column distilled out the DIPA and BDSA as a forecut and TDSA as a product under <10 mm Hg vacuum (<1.3 kPa) and 100-110° C.
Packaged 66 grams of 98% pure TDSA product into stainless steel bubblers.

Comparative Examples (C1-C3): forming a silicon nitride film using hexachlorodisilane (HCDS) with ammonia (NH$_3$)/nitrogen and PEALD: using a PEALD reactor and a small cylinder containing the HCDS and in fluid communication with the PEALD reactor, maintaining the cylinder at room temperature to increase vapor pressure thereof. Purged the PEALD reactor with nitrogen (N$_2$), wherein the PEALD reactor contains a plurality of horizontally oriented and spaced apart silicon wafers heated to 400-500° C. Then PEALD SiN film was grown with HCDS as following sequences: HCDS dose, 1 sec/N$_2$ Purge, 30 sec/Plasma with NH$_3$+N$_2$, 15 sec/N$_2$ Purge, 30 sec. Repeated the foregoing sequence of steps until a conformal silicon nitride film with a desired thickness is formed on the wafers.

Examples (T1-T6): forming a silicon nitride film using the tris(disilanyl)amine (TDSA) with nitrogen or ammonia/nitrogen and PEALD: using a PEALD reactor and a small cylinder containing the TDSA and in fluid communication with the PEALD reactor, heated the cylinder containing TDSA to 50° C. Purged the PEALD reactor with nitrogen (N$_2$), wherein the PEALD reactor contains a plurality of horizontally oriented and spaced apart silicon wafers heated to 300-500° C. Then PEALD SiN film was grown with TDSA as following sequences: TDSA dose, 1 sec/N$_2$ Purge, 30 sec/Plasma with N$_2$ or NH$_3$+N$_2$, 15 sec/N$_2$ Purge, 30 sec. Repeated the foregoing sequence of steps until a conformal silicon nitride film with a desired thickness is formed on the wafers.

| ID | precursor | Plasma Gas (sccm) | RF power (W) | T (° C.) | GPC (Å/cycle) | RI @ 632.8 nm | WER of PEALD SiN film in 500:1 HF solution (nm/min) |
|---|---|---|---|---|---|---|---|
| T1 | TDSA | N$_2$/NH$_3$ = 30/90 | 100 | 400 | 0.14 | 1.98 | |
| T2 | TDSA | N$_2$ = 50 | 100 | 300 | 0.84 | 1.94 | 0.54 |
| T3 | TDSA | N$_2$ = 50 | 100 | 350 | 0.84 | 1.96 | 0.54 |
| T4 | TDSA | N$_2$ = 50 | 100 | 400 | 0.83 | 1.96 | 0.47 |
| T5 | TDSA | N$_2$ = 50 | 100 | 450 | 0.91 | 1.95 | 0.68 |
| T6 | TDSA | N$_2$ = 50 | 100 | 500 | 0.86 | 1.95 | 0.69 |
| C1 | HCDS | N$_2$/NH$_3$ = 30/90 | 100 | 400 | 0.73 | 1.81 | 6.3 |
| C2 | HCDS | N$_2$/NH$_3$ = 30/90 | 100 | 450 | 0.71 | 1.82 | 5.4 |
| C3 | HCDS | N$_2$/NH$_3$ = 30/90 | 100 | 500 | 0.65 | 1.82 | 4.9 |

Procedure for Determination of Wet Etch Rate (WER):
1. Grow PEALD SIN thin film on silicon wafer substrate.
2. Measure the film thickness as deposited.
3. Wear PPE and prepare dilute HF solution to desired HF concentration in an acid hood.
4. Soaking the wafer in diluted HF solution for 2-4 min to etch the SiN thin film. (Etch time depends on the initial film thickness.)
5. Rinse with DI water and blow with N$_2$ gas to dry the sample.
6. Re-measure the thickness again and calculate the wet etch rate. [(avg. film thickness as deposited—avg. film thickness after etching)/(etching time)]

The invention claimed is:

1. A method for making tris(disilanyl)amine; said method comprising steps of:
   (a) contacting a disilanyl(alkyl)amine with ammonia to make bis(disilanyl)amine; and (b) allowing bis(disilanyl)amine to produce tris(disilanyl)amine and ammonia.

2. The method of claim 1 in which the disilanyl(alkyl)amine has formula: (Si$_2$H$_5$)NR$^1$R$^2$, wherein R$^1$ and R$^2$ independently are hydrogen or alkyl, provided that at least one of R$^1$ and R$^2$ is alkyl.

3. The method of claim 2 in which R$^1$ and R$^2$ independently are C$_1$-C$_8$ alkyl.

4. The method of claim 3 in which bis(disilanyl)amine is heated at a temperature from 20 to 280° C.

5. The method of claim 4 in which R$^1$ and R$^2$ are identical and represent C$_2$-C$_6$ alkyl.

6. A method of forming a silicon-containing film on a substrate, said method comprising:
   the method for making tris(disilanyl)amine of claim 1; and
   subjecting a vapor comprising the tris(disilanyl)amine to deposition conditions in the presence of the substrate to form the silicon-containing film on the substrate.

* * * * *